United States Patent
Okino

(10) Patent No.: US 8,207,744 B2
(45) Date of Patent: Jun. 26, 2012

(54) TESTING APPARATUS

(75) Inventor: Noboru Okino, Saitama (JP); Masumi Okino, legal representative, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/646,736

(22) Filed: Dec. 23, 2009

(65) Prior Publication Data

US 2010/0156434 A1 Jun. 24, 2010

Related U.S. Application Data

(63) Continuation of application No. PCT/JP2008/061578, filed on Jun. 25, 2008.

(30) Foreign Application Priority Data

Jun. 29, 2007 (JP) ................. 2007-171555

(51) Int. Cl.
*G01R 31/02* (2006.01)
(52) U.S. Cl. ............ 324/537; 324/750.16; 324/750.2; 324/757.03
(58) Field of Classification Search .......... 324/537
See application file for complete search history.

(56) References Cited

U.S. PATENT DOCUMENTS

| | | | |
|---|---|---|---|
| 5,164,905 A * | 11/1992 | Iwasaki et al. ......... | 700/112 |
| 5,747,994 A | 5/1998 | Suga | |
| 6,084,215 A * | 7/2000 | Furuya et al. .......... | 219/444.1 |
| 6,344,401 B1 * | 2/2002 | Lam .................. | 438/460 |
| 6,700,122 B2 * | 3/2004 | Matsui et al. ......... | 250/310 |
| 7,054,705 B2 * | 5/2006 | Ogawa et al. ......... | 700/121 |
| 2003/0197501 A1 * | 10/2003 | Maruyama et al. ..... | 324/158.1 |
| 2005/0253575 A1 * | 11/2005 | Takekoshi et al. ..... | 324/158.1 |

(Continued)

FOREIGN PATENT DOCUMENTS

JP    5-343500 A    12/1993

(Continued)

OTHER PUBLICATIONS

Itoyama, JPO Machine Translation of JP 5-343500.*

(Continued)

*Primary Examiner* — Thomas Valone
(74) *Attorney, Agent, or Firm* — Chen Yoshimura LLP

(57) ABSTRACT

There is provided a testing apparatus including a plurality of test units, a storage that is shared by the plurality of test units, where the storage stores therein wafers under test to be tested by the plurality of test units, a transport mechanism that transports the wafers under test between the storage and each of the plurality of test units, a mainframe that specifies a test procedure for each of the plurality of test units, a power source that is shared by the plurality of test units, where the power source supplies power to each of the plurality of test units, and a pressure source that is shared by the plurality of test units, where the pressure source supplies a pressure to each of the plurality of test units. Here, each of the plurality of test units includes a test module that transmits and receives a test signal to/from a plurality of circuits formed on a wafer under test, a connector that connects together transmission paths of the test signal between the test module and the wafer under test, a holding member that brings the wafer under test into contact with the connector when supplied with the pressure, and a housing that houses therein the holding member and the connector, where the wafer under test is to be tested within the housing.

10 Claims, 9 Drawing Sheets

U.S. PATENT DOCUMENTS

2006/0182536 A1* 8/2006 Rice et al. .................... 414/217
2007/0132477 A1* 6/2007 Balog et al. .................. 324/765

FOREIGN PATENT DOCUMENTS

| JP | 08-306750 A | | 11/1996 |
|---|---|---|---|
| JP | 11-307599 | * | 5/1999 |
| JP | 2000-346875 A | | 12/2000 |
| JP | 2001-077160 A | | 3/2001 |
| JP | 2001-077610 A | | 3/2001 |
| JP | 2002-141380 A | | 5/2002 |
| JP | 2002-286811 A | | 10/2002 |
| JP | 2003-297887 A | | 10/2003 |

OTHER PUBLICATIONS

Tomohiro, JP11-307599, Machine Translation, p. 1-10, including abstract.*

International Search Report (ISR) issued in PCT/JP2008/061578.

Written Option (PCT/ISA/237) issued in PCT/JP2008/061578 (parent application).

Taiwanese Office Action date Mar. 12, 2012, in a counterpart Taiwanese patent application 097124242. (This Taiwanese Office Action cites JP2002-141380 which has been submitted in a previous IDS, and US2006/0182536, US2007/0132477 and US2005/0253575 which have been listed by a US Examiner in a PTO-892 form).

* cited by examiner

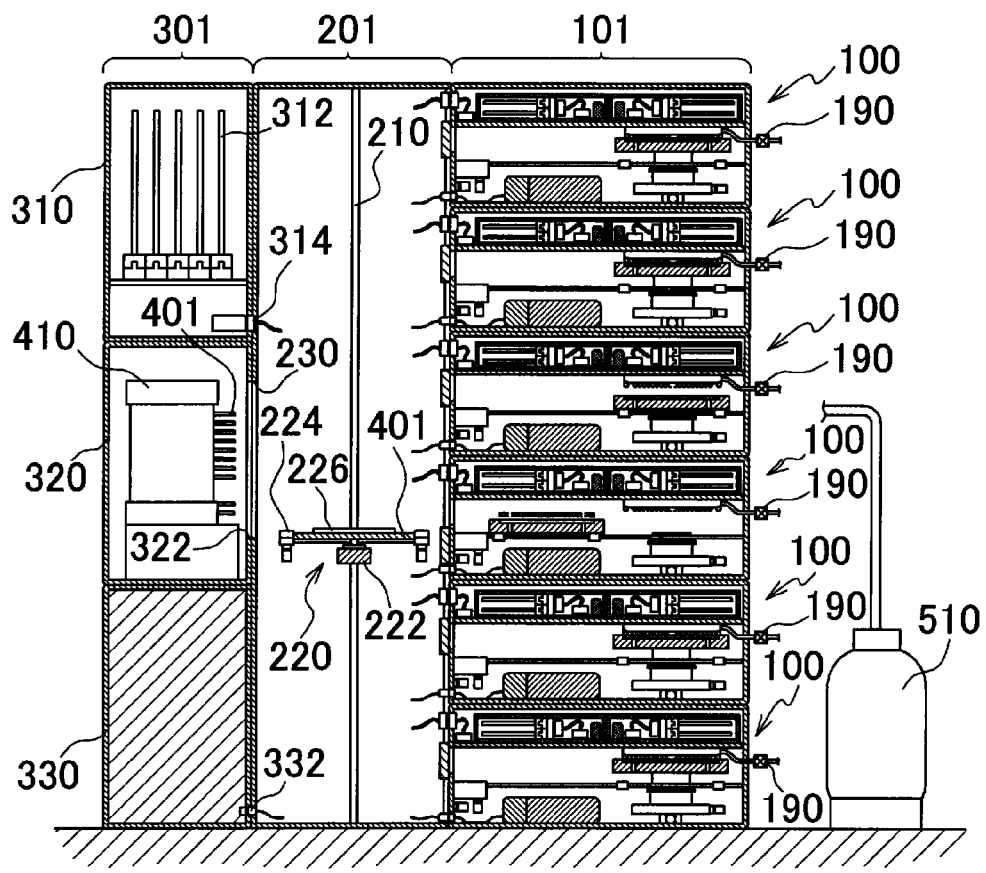
F I G . 1

TESTING APPARATUS

CROSS REFERENCE TO RELATED APPLICATION

This is a continuation application of PCT/JP2008/061578 filed on Jun. 25, 2008 which claims priority from a Japanese Patent Application No. 2007-171555 filed on Jun. 29, 2007, the contents of which are incorporated herein by reference.

BACKGROUND

1. Technical Field

The present invention relates to a testing apparatus. More specifically, the present invention relates to a testing apparatus that can simultaneously test a plurality of wafers under test.

2. Related Art

Integrated circuits are produced by performing various steps such as forming a large number of devices on a single semiconductor wafer, glass wafer or the like, then dicing the wafer into dies, and finally packaging the dies individually. Alternatively in the fabricating process of ball grid array (BGA) devices, the individual dies are packaged before the wafer is diced.

In both of the manufacturing methods mentioned above, the circuits formed on the wafer may be tested prior to the packaging step. The test in the pre-packaging step involves pressing probe pins against target locations on the wafer under test so that the circuits of the wafer under test are electrically connected to the circuits of the testing apparatus. The testing apparatus then transmits a test signal and the circuits of the wafer under test process the test signal. In this manner, the testing apparatus can evaluate the functionality and performance of the circuits.

Japanese Patent Application Publication No. 08-306750 discloses a semiconductor testing apparatus having a changeable probe card that generates a test signal, in which a self-diagnosis board that examines the operation of the semiconductor testing apparatus is mounted in place of the probe card. Such a semiconductor testing apparatus enables a variety of tests to be performed by switching probe cards and can easily examines itself by having a self-diagnosis board mounted thereon.

Japanese Patent Application Publication No. 2000-346875 discloses a probe card that supports a needle serving as a contact point with a wafer under test, in which the probe card has a heat generating pattern to comply with deformation of the wafer under test, thereby achieving an excellent contact with the wafer under test. Furthermore, Japanese Patent Application Publication No. 2001-077160 discloses a technique of improving the quality of a test signal by providing a contact point connected to a ground on the same surface as a needle functioning as a probe pin.

In recent years, the scale and functionality of integrated circuits have rapidly expanded. Thus, necessary tests have become complicated and an increasing number of types of tests are required. This tends to increase the time required to complete the tests of each integrated circuit.

Furthermore, the production quantity of integrated circuits have significantly increased due to the widespread use of diverse electronic devices. Therefore, the time occupied by the test step during the overall manufacturing process may affect the manufacturing cost.

In addition, since the time required to complete tests has increased, the equipment of the testing apparatus such as a handler to transport wafers under test has a lowered operating rate. This lowers the utilization efficiency of the testing apparatus and then contributes to a relative increase of the test cost.

In light of the above, it is desired to raise the throughput of the test step in the integrated circuit manufacturing process. Another demand is to improve the utilization efficiency of the respective constituents of the testing apparatus.

SUMMARY

Therefore, it is an object of an aspect of the innovations herein to provide a testing apparatus, which is capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary testing apparatus may comprise a plurality of test units, a storage that is shared by the plurality of test units, where the storage stores therein wafers under test to be tested by the plurality of test units, a transport mechanism that transports the wafers under test between the storage and each of the plurality of test units, a mainframe that specifies a test procedure for each of the plurality of test units, a power source that is shared by the plurality of test units, where the power source supplies power to each of the plurality of test units, and a pressure source that is shared by the plurality of test units, where the pressure source supplies a pressure to each of the plurality of test units. Here, each of the plurality of test units includes a test module that transmits and receives a test signal to/from a plurality of circuits formed on a wafer under test, a connector that connects together transmission paths of the test signal between the test module and the wafer under test, a holding member that brings the wafer under test into contact with the connector when supplied with the pressure, and a housing that houses therein the holding member and the connector, where the wafer under test is to be tested within the housing.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 1 is a schematic cross-sectional view illustrating the structure of a testing apparatus 200 as a whole.

DESCRIPTION OF EXEMPLARY EMBODIMENTS

Hereinafter, some aspects of the present invention will be described through embodiments. The embodiments do not limit the invention according to the claims, and all the combinations of the features described in the embodiments are not necessarily essential to means provided by aspects of the invention.

Hereinafter, some embodiments of the present invention will be described. The embodiments do not limit the invention according to the claims, and all the combinations of the features described in the embodiments are not necessarily essential to means provided by aspects of the invention.

First Embodiment

Figure 2:
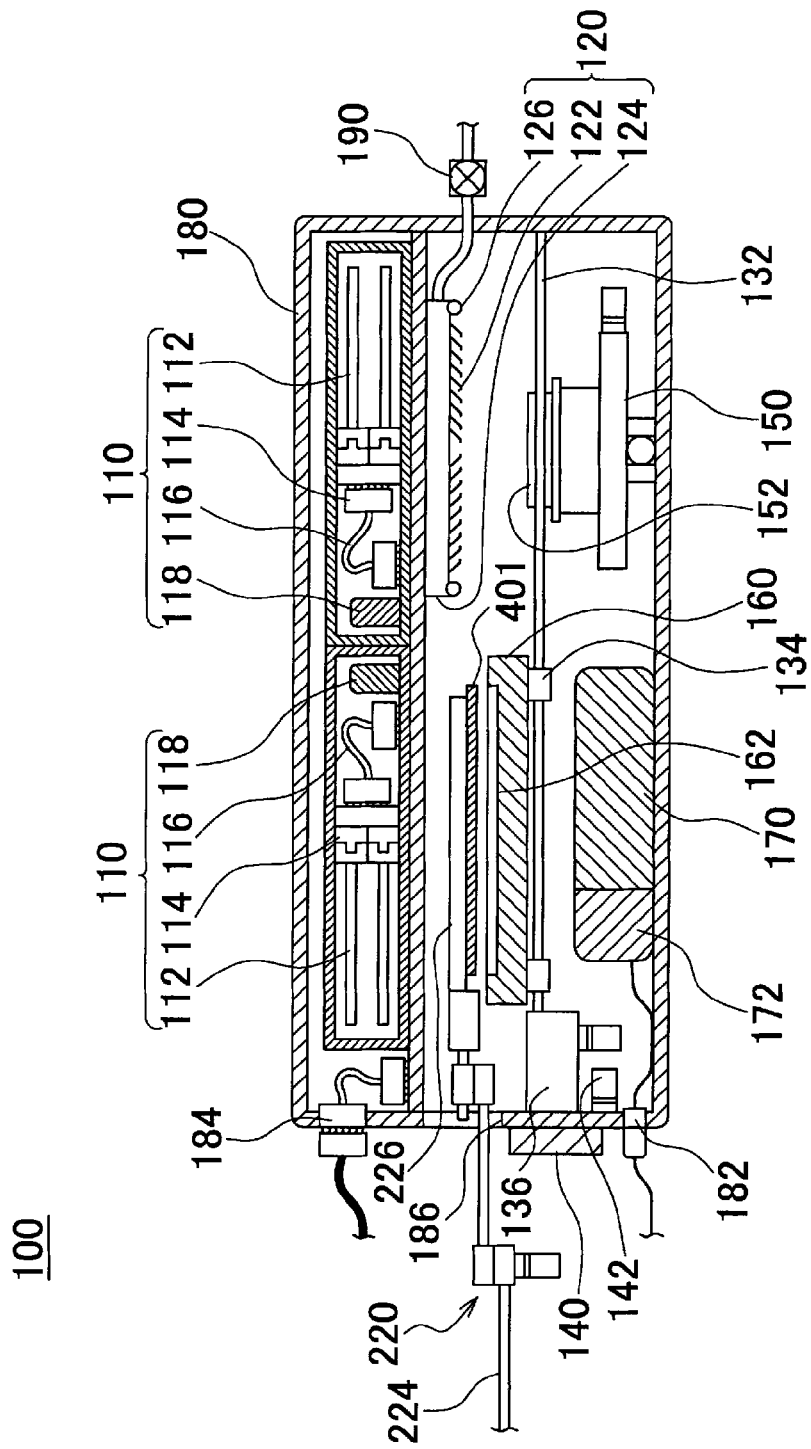
FIG. 2 is a schematic cross-sectional view illustrating the internal structure and a certain operational state of a test unit 100.

FIG. 1 is a schematic cross-sectional view illustrating the structure of a testing apparatus 200 including a plurality of test units 100 (see FIG. 2). As shown in FIG. 1, the testing apparatus 200 includes a test unit stack 101, a handler 201, and a common stack 301. The test unit stack 101 is formed by stacking the test units 100. The handler 201 is a transport mechanism shared by the test units 100. The common stack 301 is also shared by the test units 100. The testing apparatus 200 further includes a pressure source 510 that supplies a negative or positive pressure to the test units 100. The pressure source 510 used in this example is a decompression tank that supplies a negative pressure to the test units 100.

The test unit stack 101 is formed by vertically stacking the test units 100 that all has the same structure. Each test unit 100 functions as a test module 110 (see FIG. 2) that generates a test signal and as a test head having a mechanism to provide electrical coupling between a wafer under test 401 and the test module 110. Thus, the testing apparatus 200 can test a plurality of wafers under test 401 in parallel. The internal structure and operation of the test units 100 will be described later with reference to FIGS. 2 to 4.

The handler 201 includes a guide pole 210 that can cover the entire height of the test unit stack 101 and a manipulator 220 (see FIG. 6) that moves up and down along the guide pole 210. The manipulator 220 includes a lift 222 that moves up and down along the guide pole 210, a pantograph 224 that is transported by the lift 222 and that expands and contracts while moving up and down, and a chuck 226 that is supported at the end of the pantograph 224. The relative angle formed between the lift 222 and the pantograph 224, and between the pantograph 224 and the chuck 226 can be changed. Thus, the wafers under test 401 can be moved greatly in a limited space within the testing apparatus 200.

The internal space within the handler 201 is in communication with the internal space within a wafer storage 320, described later, through a gate 230. Thus, the wafers under test 401 are taken out from a wafer cassette 410, described later, one at a time to be loaded onto the test units 100. Furthermore, once tests are completed, the wafers under test 401 are unloaded from the test units 100 and returned to the wafer cassette 410.

Here, the tests on the wafers under test 401 may require a time ranging from a few minutes to more than one hour depending on what are carried out to perform the tests. When compared with such a time required for the tests, the time required to transport the wafers under test 401 is short. Therefore, only a small number of handlers 201 can be sufficient to load/unload the wafers under test 401 onto/from a large number of test units 100. In other words, a single handler 201 may load/unload the wafers under test 401 onto/from a plurality of test units 100, so that the improved utilization efficiency can be achieved for the handler 201.

The above-described handler 201 includes a single guide pole 210 and a single manipulator 220 attached to the guide pole 210. Alternatively, a plurality of manipulators 220 may be attached to a single guide pole 210 to share the transport task of the wafers under test 401, which can enhance the handling capability of the handler 201. Alternatively, a plurality of guide poles 210 can be provided so as to respectively have a plurality of manipulators 220 attached thereto. In this case, the manipulators 220 can operate completely independently from each other.

The common stack 301 includes a mainframe 310, the wafer storage 320, and a common power source 330. The mainframe 310 houses therein a plurality of control boards 312 and generates a control signal to control the operation of the entire testing apparatus 200. The generated control signal is transmitted to the other constituents of the testing apparatus 200, which are connected to the mainframe 310 via a signal connector 314.

The wafer storage 320 stores the wafer cassette 410 that houses therein the wafers under test 401 to be tested. The wafer storage 320 is in communication with the internal space of the handler 201 through a gate 322. FIG. 1 only shows a single wafer cassette 410 but the wafers under test 401 may be housed within different wafer cassettes 410 before and after the tests. In this case, the wafer storage 320 stores a plurality of wafer cassettes 410.

The common power source 330 receives power supply from an external commercial power source or the like. The supplied power is distributed via a power source connector 332 to the respective constituents of the testing apparatus 200 at appropriate voltages. Although not shown, the common power source 330 is preferably provided with a safety arrangement that blocks external noise and interrupts an overcurrent output.

The pressure source 510 reserves a negative pressure and supplies the negative pressure to each of the test units 100. The negative pressure from the pressure source 510 is coupled to each test unit 100 through a valve 190. The valve 190 is opened and closed by a control signal or test signal, so that the negative pressure is intermittently supplied to each test unit 100. The negative pressure supplied to a test module is utilized to press the wafer under test 401 against a probe card 122 (see FIG. 2) as will be described later with reference to FIG. 4. The negative pressure can also be used to perform other operations, for example, to transport the wafers under test 401.

To stabilize the negative pressure supplied to the test unit 100, the test unit 100 may preferably have a pressure sensor provided therein to adjust the internal pressure of the pressure source 510. Alternatively, a decompression valve may be provided in each test unit 100 to adjust the negative pressure supplied to the test unit 100.

FIG. 2 is a schematic cross-sectional view illustrating a single individual test unit 100. As shown in FIG. 2, the test unit 100 has, within a common case 180, a plurality of test modules 110, a contact unit 120 for the wafer under test 401 (see FIG. 5), and a series of mechanisms to bring the wafer under test 401 into contact with the contact unit 120. As a whole, the test unit 100 functions as a test head.

According to the test unit 100, each test module 110 houses therein test boards 112 that each generate a test signal and process a test signal received from circuits 403 (see FIG. 5) on the wafer under test 401. Each test board 112 is coupled to the contact unit 120, described later, through a test signal connector 114 and a test signal cable 116. Therefore, the test boards 112 can be easily switched by inserting and pulling out the test signal connector 114 into/from the test boards 112, so that different tests can take place.

Furthermore, the series of test modules 110 are coupled to the mainframe 310 via the signal connector 184. In this way, the test units 100 can cooperate with each other in carrying out tests under the integral control of the mainframe 310.

Each test module 110 further includes a breaker 118 that interrupts an overcurrent which may occur on the circuits 403 on the wafer under test 401. The breaker 118 can prevent expensive components such as the probe card 122 from being burnt and damaged. Here, it would be preferable to provide double protection against the overcurrent, such that a breaker 118 that protects the entire wafer under test 401 against an overcurrent and another breaker 118 that protects each separate circuit 403 on the wafer under test 401 against an overcurrent are disposed.

The contact unit 120 includes a chuck 124 that attracts by suction the wafer under test 401 by means of the negative pressure supplied from the pressure source 510 and a probe card 122 that protrudes from the lower surface of the chuck 124. On the lower surface of the chuck 124, a seal 126 is attached to surround the probe card 122. When the wafer under test 401 comes into contact with the chuck 124, the seal 126 seals airtight the gap between the chuck 124 and the wafer under test 401 around the edge of the wafer under test 401, so that the chuck 124 attracts by suction the wafer under test 401.

The probe card 122 has a large number of probe pins hanging downwards. The ends of the probe pins correspond to the positions of the pads on the wafer under test 401. Thus, when the wafer under test 401 is pressed against the probe card 122, electrical connection can be established between the circuits 403 on the wafer under test 401 and the test unit 100.

Below the contact unit 120, a stage 150 and a lift 152 mounted on the stage 150 are positioned. The stage 150 moves the upper surface thereof horizontally in two dimensions, so that the wafer under test 401 mounted on the stage 150 can be accurately aligned to the contact unit 120. This alignment can be controlled visually by using a camera or the like, not shown, or alternatively can be automatically performed by making use of a flat 405 (see FIG. 5) or the like formed on the wafer under test 401.

The lift 152 can move up and down the upper surface thereof as will be described later. In this manner, the lift 152 can raise the wafer under test 401 mounted on the lift 152 towards the contact unit 120. The stage 150 and lift 152 each include a drive motor. Thus, the stage 150 and lift 152 can be externally controlled by an electrical signal.

The test unit 100 further includes a wafer tray 160 having the wafer under test 401 placed thereon, which is loaded there by the manipulator 220 of the handler 201, and a carriage 134 that moves the wafer tray 160 having the wafer under test 401 mounted thereon to above the lift 152. The wafer tray 160 has a pit 162 whose internal surface is shaped complementary to the wafer under test 401. The pit 162 holds and protects the wafer under test 401, which is loaded thereto by the manipulator 220.

Although not shown, a heater may be embedded in the wafer tray 160 in order to heat the wafer under test 401 to be tested to a predetermined temperature. Furthermore, a temperature sensor may be provided in the wafer tray 160 to perform feedback control. In this manner, the plurality of test units 100 can perform tests under a uniform condition, irrespective of the states of the individual wafers under test 401.

The wafer tray 160 is placed on the carriage 134 within the test unit 100. Into the carriage 134, a guide rail 132 is inserted which is disposed horizontally within the case 180. At one end of the guide rail 132, a carriage driver 136 is provided which drives and moves the carriage 134. Thus, the carriage 134 moves horizontally along the guide rail 132.

In the state shown in FIG. 2, the chuck 226 of the manipulator 220 loads the wafer under test 401 to above the wafer tray 160, which is positioned in the vicinity of, in the drawing, the left end of the guide rail 132. The case 180 has a gate 186 that opens on the side wall thereof, and the wafer under test 401 is loaded through the gate 186.

The test unit 100 may further include a regulator 170 and a breaker 172 immediately after the power source connector 182 that receives power supply from outside. The regulator 170 manages the power that is supplied from the common power source 330 and distributed inside the test unit 100, to stabilize the voltage. In this manner, the regulator 170 can compensate for, for example, variation in the power source voltage caused by the operations of other test units 100 and thus allow the respective constituents of the test unit 100 to operate stably. In addition, the regulator 170 contributes to improve the accuracy of the tests.

The breaker 172 cuts the test unit 100 off the common power source 330 when there is a risk of an overcurrent in the test unit 100. In this manner, the breaker 172 can prevent the test unit 100 from being damaged by an overcurrent. Also, the breaker 172 can prevent the failure taking place in the test unit 100 from affecting other test units 100 and eventually the testing apparatus 200 as a whole. Furthermore, while a test is taking place, the breaker 172 can prevent an overcurrent from damaging the wafer under test 401 and thus prevent the deterioration in the yield of the wafer under test 401.

Figure 3:
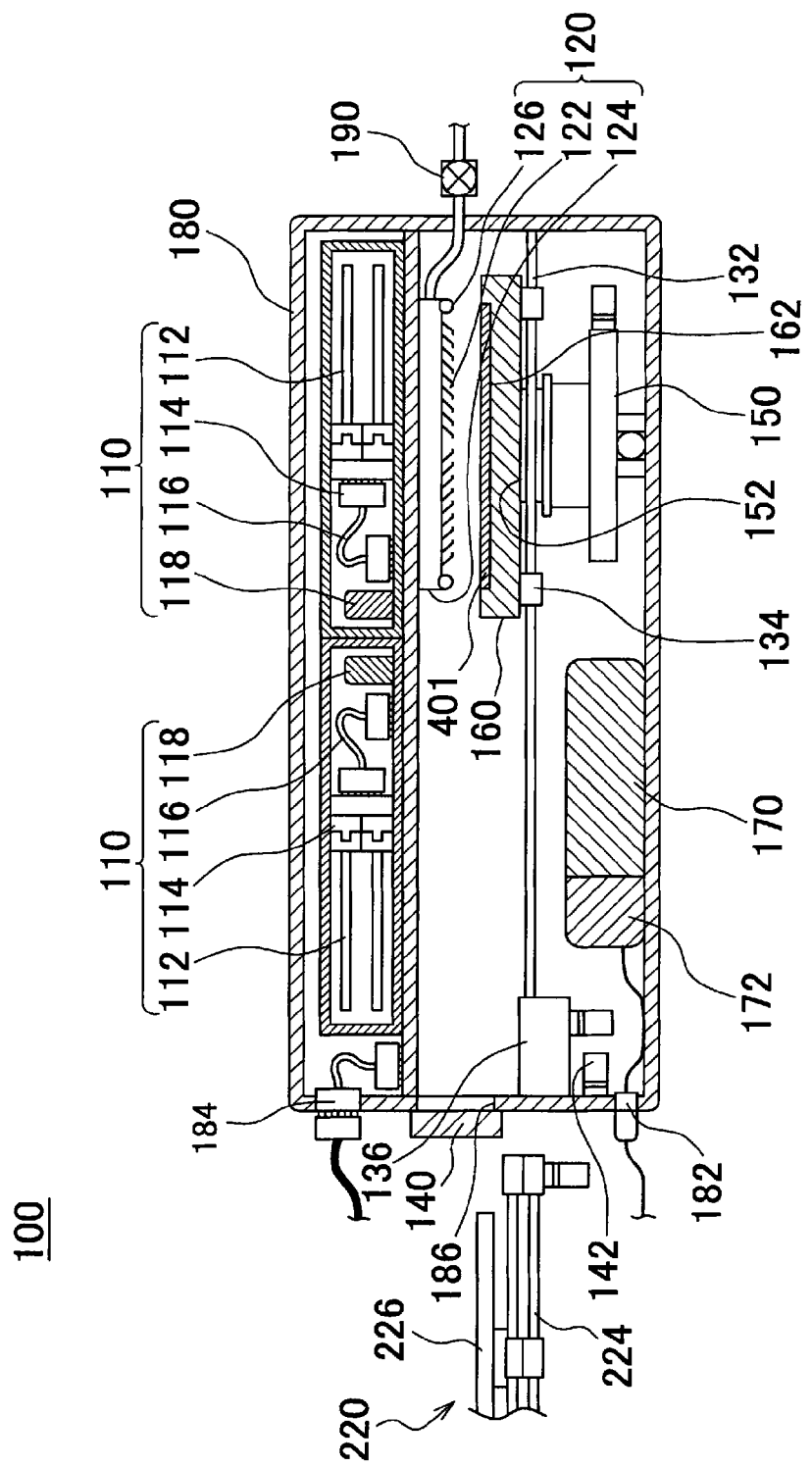
FIG. 3 is a schematic cross-sectional view illustrating a different operational state of the test unit 100.

FIG. 3 illustrates a different operational state of the test unit 100 of FIG. 2. In the operational state shown in FIG. 3, the manipulator 220 moves outside the case 180. Furthermore, a shutter closes the gate 186 of the case 180 by being driven by a shutter motor 142 mounted within the case 180. In this way, the internal space of the case 180 is cut off from the external environment.

Within the case 180, the carriage 134 moves along the guide rail 132. Consequently, the wafer tray 160, which houses the wafer under test 401 in the pit 162 thereof, is transported to above the lift 152. In other words, the wafer under test 401 is consequently transported to below the contact unit 120.

Figure 4:
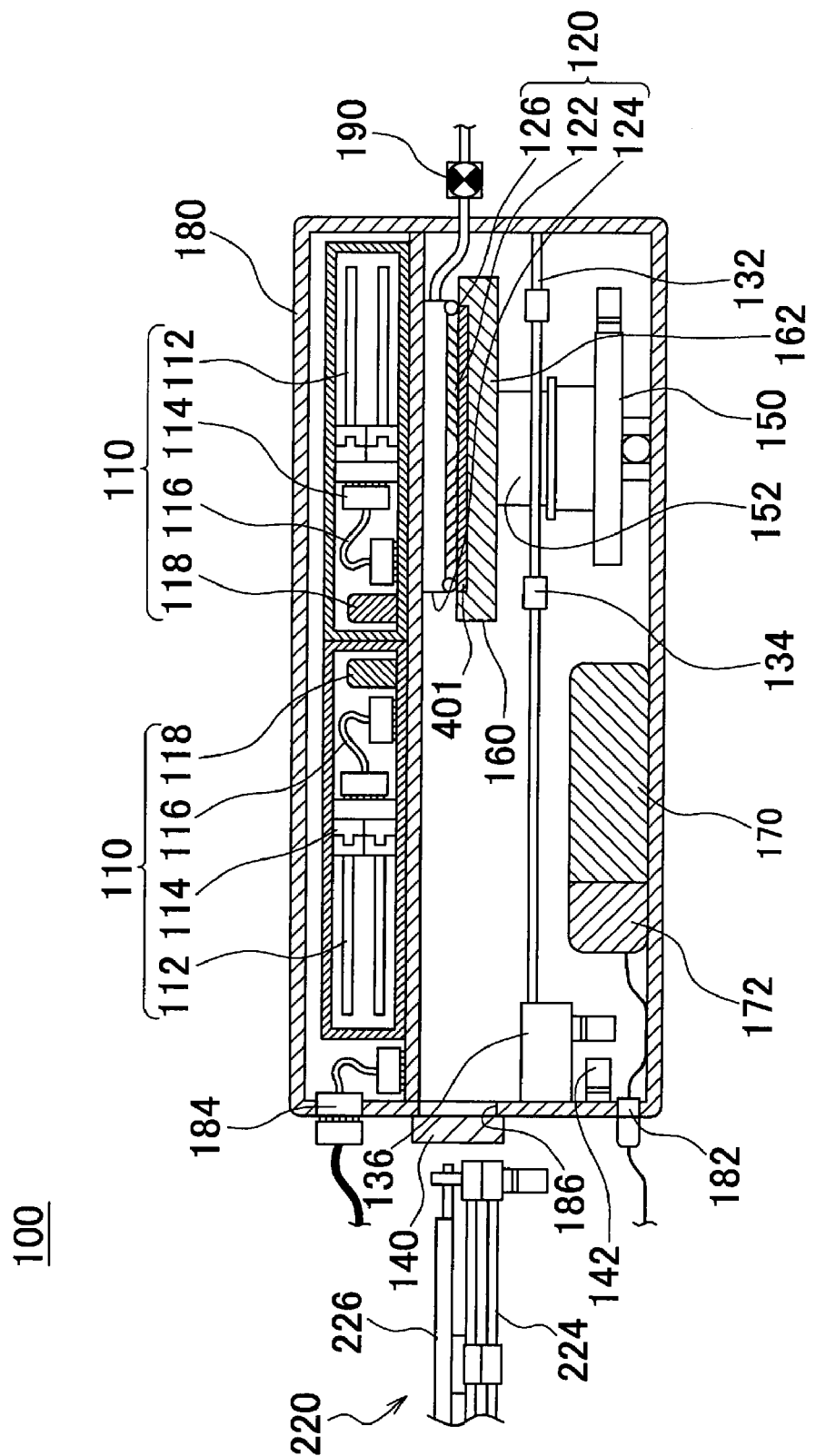
FIG. 4 is a schematic cross-sectional view illustrating a further different operational state of the test unit 100.

FIG. 4 illustrates a further different operational state of the test unit 100 shown in FIGS. 2 and 3. In the operational state shown in FIG. 4, the lift 152 moves the wafer tray 160 up, so that the wafer under test 401 becomes pressed against the contact unit 120. As a result, the seal 126 seals airtight the space between the lower surface of the chuck 124 and the upper surface of the wafer under test 401.

Furthermore, the valve 190 is opened, so that the chuck 124 can communicate into the negative pressure within the pressure source 510 and thus attracts by suction the wafer under test 401. As a consequence, the lower ends of the probe pins of the probe card 122 are pressed against the upper surface of the wafer under test 401, which electrically connects the circuits 403 formed on the wafer under test 401 to the test unit 100.

Since temporary electrical connection is formed between the wafer under test 401 and the test unit 100 in this way, the test unit 100 can test the wafer under test 401 by causing the circuits 403 formed on the surface of the wafer under test 401 to operate. Here, high efficiency is achieved since a large number of circuits 403 on a single wafer under test 401 can be collectively tested. If the test detects failures in any circuits 403, such defective circuits 403 are discarded before the die-bonding, packaging and other subsequent steps. Thus, the yield after the packaging step can be improved.

Since the circuits 403 formed on the wafer under test 401 each have a plurality of pads, the probe card 122 has a very large number of probe pins in order to form electrical connection with all of the pads. This inevitably increases the cost of the probe card 122. Here, it should be noted that each probe pin is thin and may be burned down when an excessive current flows through the probe pin. If such happens, the entire probe card 122 including any burned probe pins is discarded.

Figure 5:
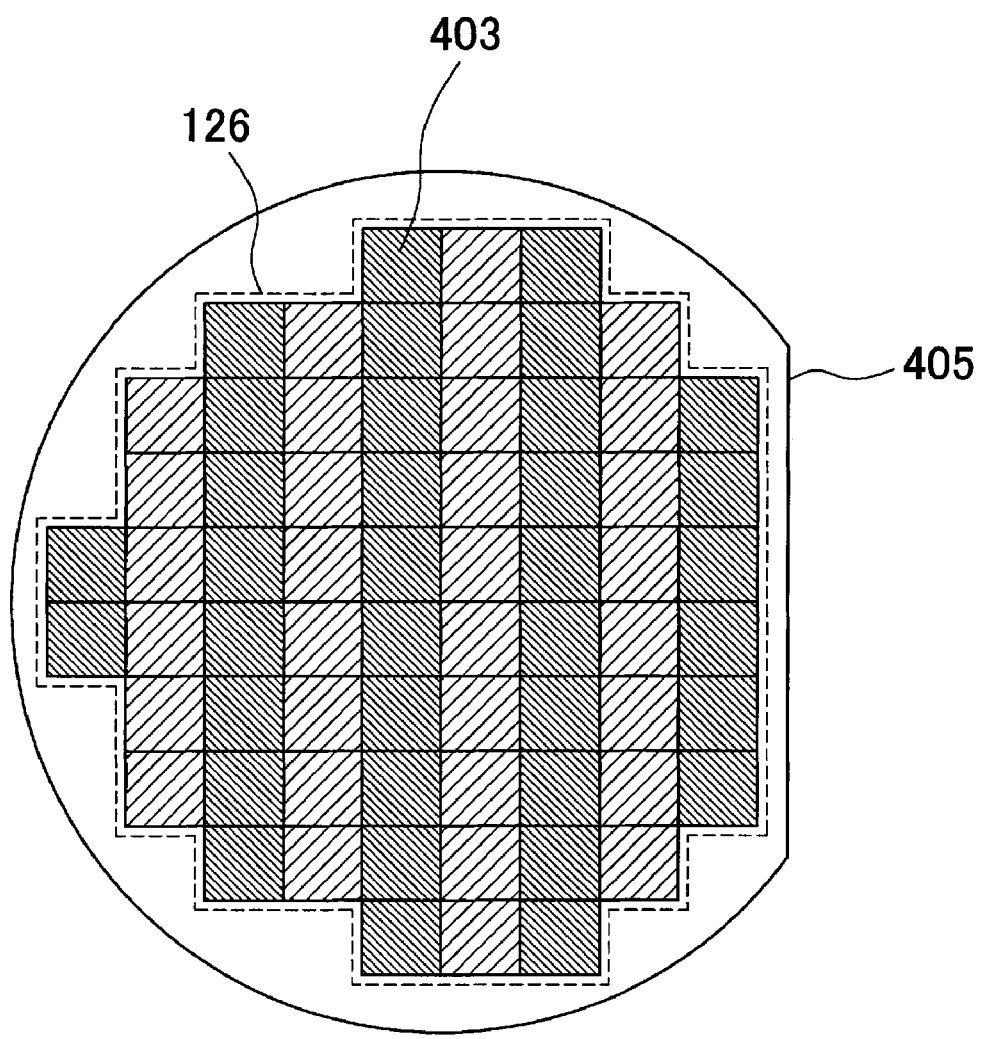
FIG. 5 is a schematic view illustrating the function of a seal 126.

FIG. 5 illustrates the state where the seal 126 is in contact with the wafer under test 401 while the test unit 100 takes the state shown in FIG. 4. As shown in FIG. 5, the circuits 403 are arranged in a matrix on the surface of the wafer under test 401. In FIG. 5, the circuits 403 are hatched in two different manners to easily identify the boundaries, but the wafer under test 401 usually has a plurality of identical circuits formed thereon.

The wafer under test 401 have a circular shape excluding the flat 405, but the circuits 403 usually have a rectangular shape. Thus, the peripheral edge portion of the wafer under test 401 has no circuits 403 formed thereon and remains as a smooth region. The chuck 226 of the manipulator 220 mentioned earlier attracts by suction the wafer under test 401 at this smooth region.

The seal 126 contacts the wafer under test 401 in the vicinity of the region in which the circuits 403 are formed. This enables the seal 126 and the wafer under test 401 to come into tight contact with each other, thereby achieving high air-tightness. This also reduces the region that should be decompressed for suction, thereby reducing the consumption of the negative pressure within the pressure source 510.

As seen from FIG. 5, the circuits 403 are arranged asymmetrically on the surface of the wafer under test 401. Accordingly, the seal 126 that is in close contact with the wafer under test 401 in the vicinity of the circuits 403 also have an asymmetrical shape. For this reason, when the chuck 124 attracts by suction the wafer under test 401, the wafer under test 401 is preferably oriented in a fixed manner.

The function of changing the orientation of the wafer under test 401 can be assumed by any of the manipulator 220 of the handler 201, the wafer tray 160, the stage 150, and the lift 152, which is selected as appropriate. The orientation of the wafer under test 401 is detected by detecting the flat 405 of the wafer under test 401, visually observing the wafer under test 401 by using the camera or the like that is used for the alignment of the wafer under test 401, or any other methods.

In the above-described embodiment, the wafer under test 401 is pressed against the probe card 122 by decompressing the space sealed by the wafer under test 401, the seal 126 and the chuck 124. The same effects can be obtained as long as the sealed space has a lower pressure than the external pressure. Therefore, the same effects may be obtained instead by increasing the pressure within the case 180 and adapting the sealed space to communicate with the atmospheric pressure. In this case, however, it is indispensable for the shutter 140 to seal the gate 186 airtight.

Figure 6:
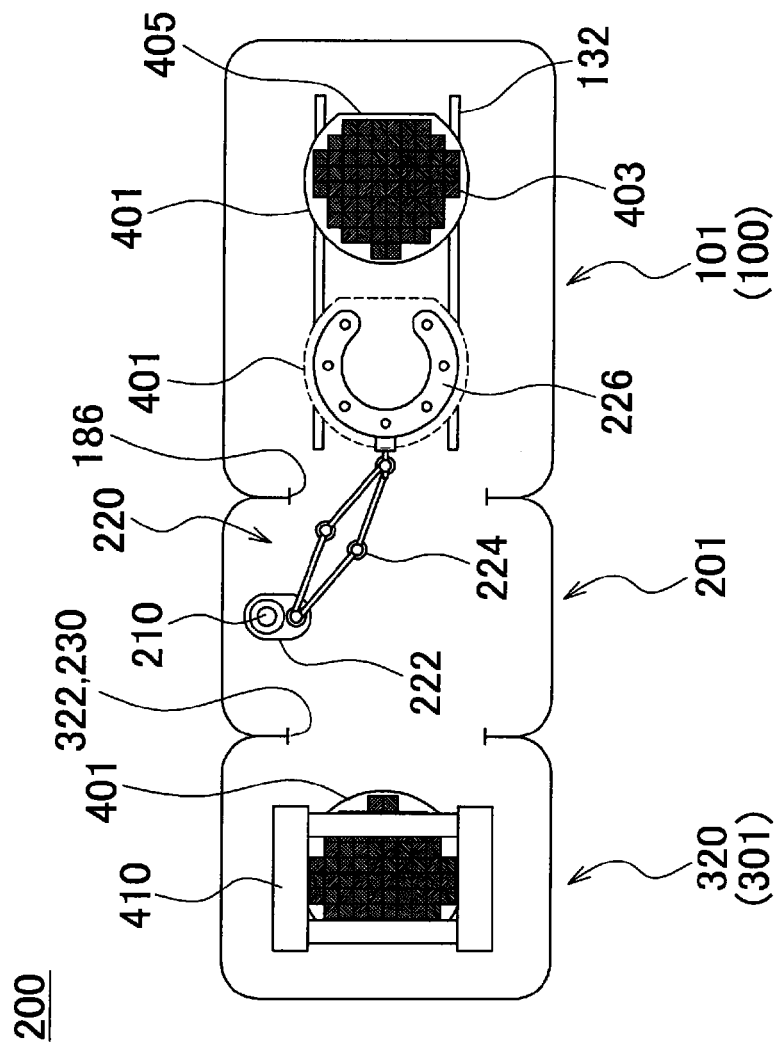
FIG. 6 is a schematic plan view illustrating a planar layout of the testing apparatus 200.

FIG. 6 schematically illustrates the planar layout of the testing apparatus 200 shown in FIG. 1. As shown in FIG. 6, at the height of the wafer storage 320, the test units 100 (the test unit stack 101), the handler 201, the wafer storage 320 (the common stack 301) are arranged in a line, occupying the same area as a general semiconductor testing apparatus.

The internal space within the handler 201 is in communication with the wafer storage 320 via the gates 322 and 230. Thus, the handler 201 can take the wafers under test 401 out of or into the wafer cassette 410 stored in the wafer storage 320. Furthermore, the handler 201 can load or unload the wafers under test 401 onto/from the test units 100 through the gates 186.

The shown testing apparatus 200 includes the test unit stack 101 in which the plurality of test units 100 are stacked, as shown in FIG. 1. The testing apparatus 200 can thus simultaneously test the plurality of wafers under test 401. As a result, the testing apparatus 200 can accomplish an increased handling capability without increasing the area occupied by the testing apparatus 200. In other words, the testing apparatus 200 can shorten the time required to test a single wafer under test 401.

A test on each wafer under test 401 ends after the wafer under test 401 goes through a predetermined test sequence once, if the test detects no failures. On the other hand, if the test detects any failures, the test may be repeated. If such occurs, it takes an enormous time to complete testing the wafer under test 401. The testing apparatus 200, however, includes a plurality of test units 100 and thus can allow one or more test units 100 that have finished testing wafers under test 401 to test the next wafer under test 401. As a consequence, if tests on a plurality of wafers under test 401 detect failures in some of the wafers under test 401, the adverse effect on the throughput of the testing apparatus 200 is only limited.

Being configured to simultaneously test a plurality of wafers under test 401, the testing apparatus 200 can collectively test a plurality of wafers under test 401 stored in a single wafer cassette 410 or a plurality of wafers under test 401 in the same lot. In this manner, the testing apparatus 200 can know the tendency in the test results for each wafer cassette 410 or each lot. From such a point of view, the number of the test units 100 forming the test unit stack 101 is preferably determined depending on the number of the wafers under test 401 stored in the wafer cassette 410. Specifically, the number of the test units 100 may be set equal to a multiple or divisor of the number of the wafers under test 401 housed within the wafer cassette 410. This can achieve high testing efficiency as a whole.

In the testing apparatus 200 shown in FIG. 1, the mainframe 310, the wafer storage 320, and the common power source 330 form the common stack 301. Here, the mainframe 310 and the common power source 330 are coupled to other constituents by cables and thus are not necessarily positioned physically adjacent to the handler 201. Therefore, it is possible that the common stack 301 includes a plurality of wafer storages 320 and the mainframe 310 and the common power source 330 are provided at a different location. In this manner, the testing apparatus 200 can be configured to perform a larger number of tests.

Figure 7:
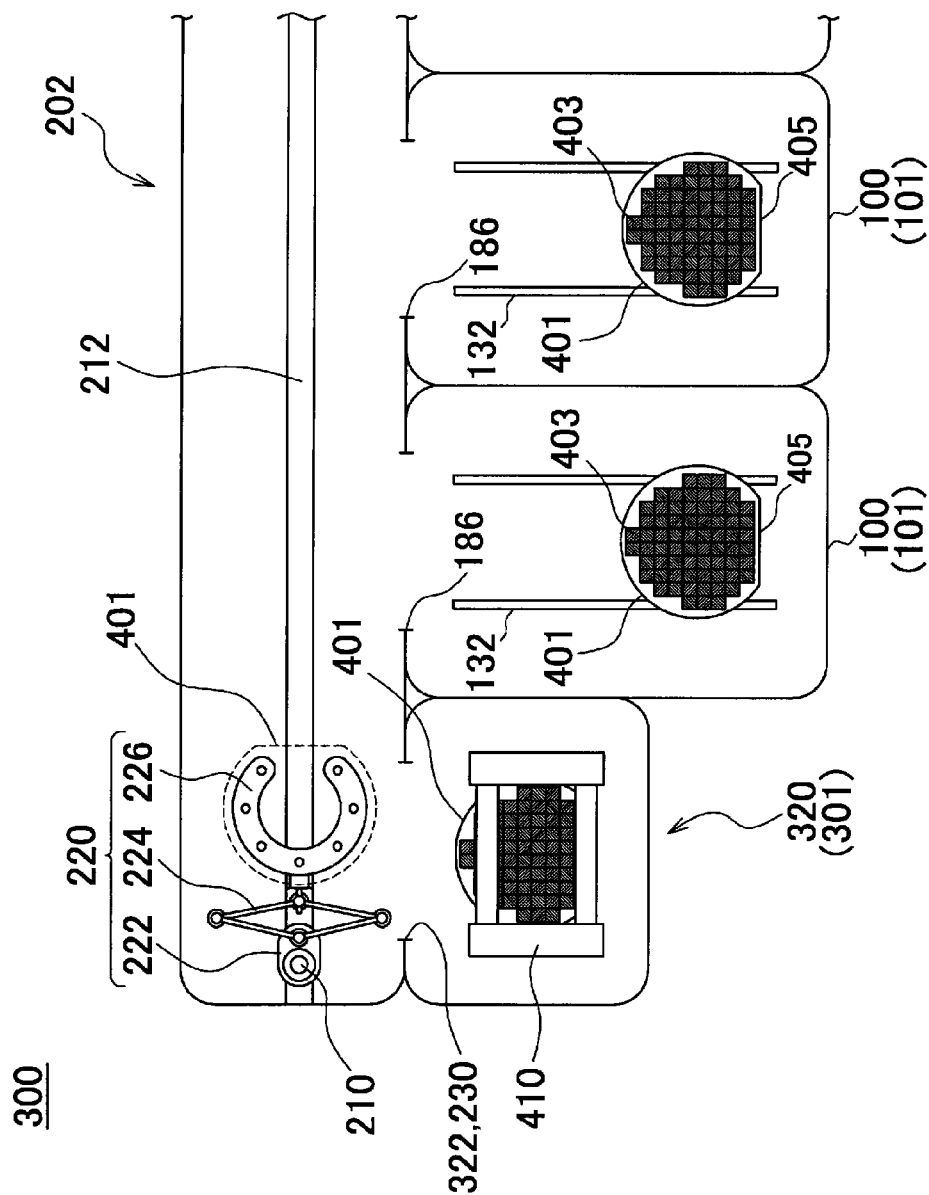
FIG. 7 is a schematic plan view illustrating a planar layout of a different testing apparatus 300.

FIG. 7 is a schematic plan view illustrating a testing apparatus 300 having a different layout with its horizontal plane including the wafer storage 320, similarly to FIG. 6. As shown in FIG. 7, the testing apparatus 300 includes a plurality of test unit stacks 101. Therefore, the test units 100 are arranged two-dimensionally, that is to say, vertically and horizontally.

The internal space within a handler 201 is in communication with the wafer storage 320 through the gates 322 and 230. Therefore, the handler 201 can take the wafers under test 401 out of or into the wafer cassette 410 stored in the wafer storage 320. Furthermore, the handler 201 can load or unload the wafers under test 401 onto/from the test units 100 through the gates 186.

Note that, in the testing apparatus 300, the gate 322 of the wafer storage 320 opens in the same direction as the gates 186 of the test units 100. Correspondingly to this structure, the handler 202 has dimensions covering the entire width of the testing apparatus 300 so as to be in communication with the wafer storage 320 and all of the test unit stacks 101. The handler 202 includes a guide rail 212 that moves the guide pole 210 along the arrangement of the wafer storage 320 and the test unit stacks 101.

Structured in the above-described manner, the handler 202 can move the manipulator 220, which has taken out a wafer under test 401 from the wafer storage 320, to the front of a given test unit stack 101 and load the wafer under test 401 to a given test unit 100. Also, the handler 202 can unload a wafer under test 401 from any test unit 100 and return the unloaded wafer under test 401 back to the wafer storage 320.

Figure 8:
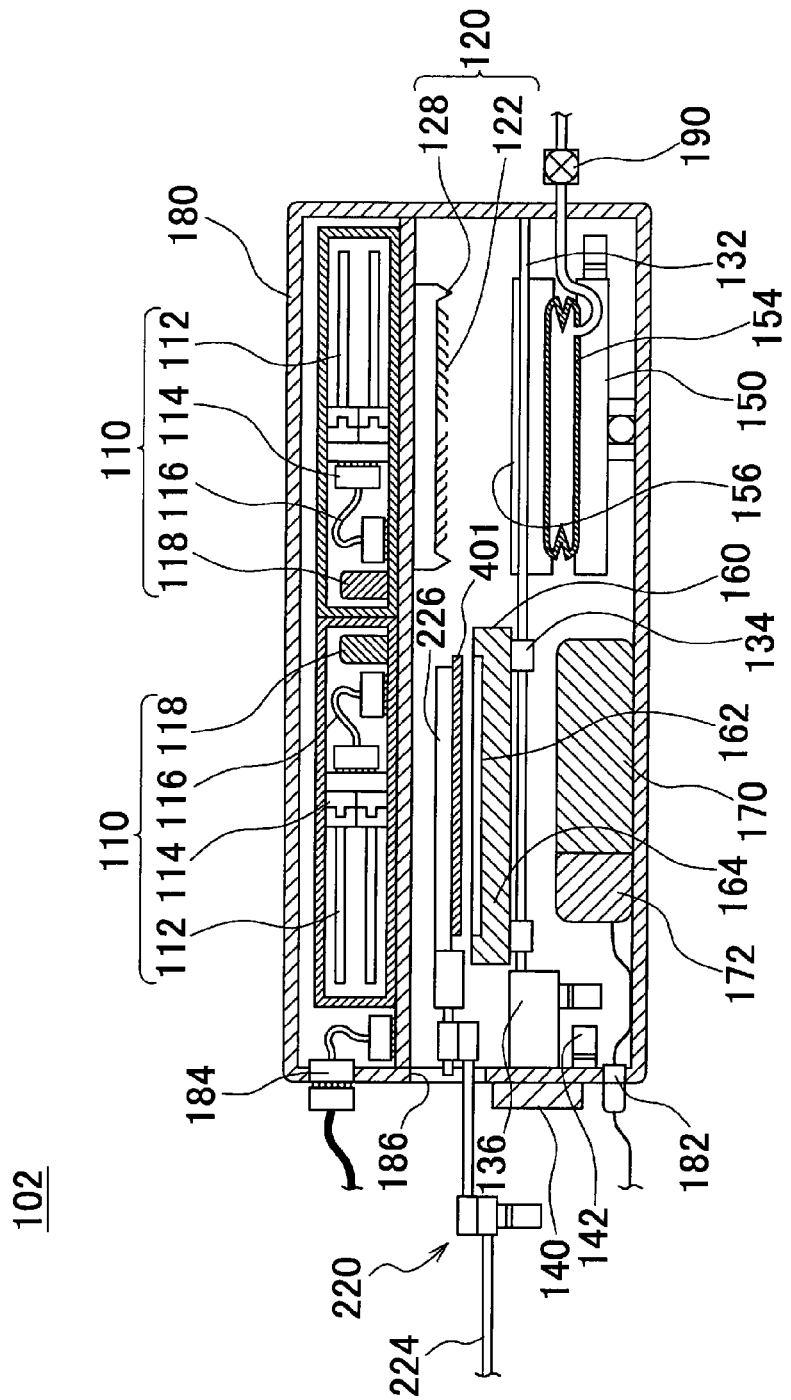
FIG. 8 illustrates the structure of a test unit 102 relating to a different embodiment.

FIG. 8 is a schematic cross-sectional view illustrating the structure of a test unit 102 relating to a different embodiment, which can be used in the testing apparatuses 200 and 300. Some of the constituents of the test unit 102 are the same as the corresponding constituents of the test unit 100 described with reference to FIGS. 2 to 4. Such constituents are assigned with the same reference numerals as in FIGS. 2 to 4 and not explained except for the differences.

As shown in FIG. 8, the test unit 102 is uniquely characterized by the structures of the contact unit 120 and a lift 156. Specifically speaking, the contact unit 120 of the test unit 102 includes a bumper 128 and the probe card 122 that come into contact with the wafer under test 401 when the wafer under test 401 is pressed against them as will be described later, but does not include the chuck 124.

The lift 156 is supported by the stage 150 via a balloon 154 that moves up and down the lift 156. The balloon 154 is in communication with the pressure source 510 via the valve 190. It should be noted here that the pressure source 510 used in this embodiment is a positive pressure source that provides a higher pressure than the atmosphere within the case 180.

Figure 9:
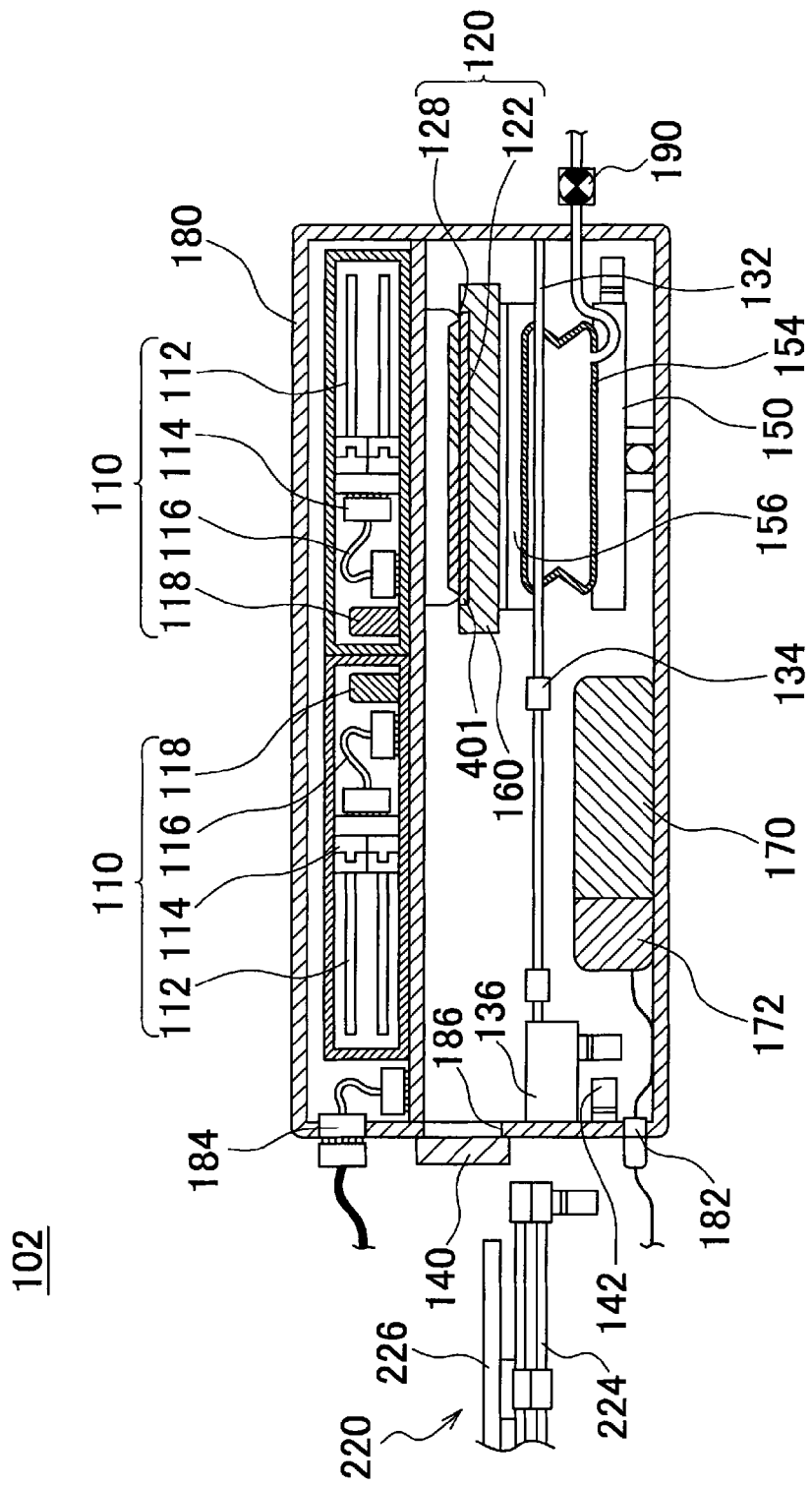
FIG. 9 illustrates the operation of the test unit 102.

FIG. 9 illustrates the operation of the test unit 102. As shown in FIG. 9, when the valve 190 is opened and the internal space within the balloon 154 thus starts communicating with the positive pressure source 510, the balloon 154 expands to move the lift 156 up. In this manner, the wafer under test 401 mounted on the lift 156 moves up and eventually comes into contact with the bumper 128 and the probe card 122.

Here, the balloon 154 is elastic. Because of this feature, even when the contact surface of the probe card 122 and the surface of the wafer under test 401 are oriented at different angles for some reason, the lift 156 and the wafer under test 401 are easily adjusted so that the wafer under test 401 comes into tight contact with the probe card 122 and the bumper 128. In this case, a high pressure can be applied within the range of the strength of the balloon 154. Therefore, the test unit 102 can be used to test packages in addition to the wafers under test 401.

As illustrated in FIG. 9, the balloon 154 has accordion-like side surfaces. Therefore, the balloon 154 expands in an anisotropic manner when the internal pressure increases, specifically speaking, expands significantly vertically but only slightly horizontally. Thus, the balloon 154 can efficiently raise the lift 156.

In the above-described embodiments, attracting by suction the wafer under test 401 by means of the chuck 124 or lifting the wafer under test 401 by the balloon 154 is realized by using the negative or positive pressure supplied from the pressure source 510. However, the utilization of the negative or positive pressure supplied from the pressure source 510 is not limited to such and can be expanded to open and close the shutter 140, move the carriage 134, drive the stage 150 and the like. In this manner, the test units 100 and 102 can be provided with sufficient drive power without generating electrical noise.

As described above in detail, the testing apparatuses 200 and 300 relating to the above-described embodiments can collectively test a plurality of wafers under test 401. Accordingly, the time required to complete the test step can be shortened and the test cost can be lowered. Also, the mainframe 310, the handler 201 and other constituents are shared by a plurality of test units 100 or 102. This sharing can reduce the equipment investment and improve the operation rate. Furthermore, the operations of the testing apparatuses 200 and 300 can be automated, which can further reduce the test cost.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alternations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A testing apparatus comprising:
   a plurality of test units for testing a plurality of wafers under test in parallel, the number of test units being a multiple or divisor of the number of wafers stored in a wafer cassette;
   a storage that is shared by the plurality of test units, the storage storing therein the wafers under test to be tested by the plurality of test units;
   a transport mechanism that transports the wafers under test between the storage and each of the plurality of test units;
   a mainframe that specifies a test procedure for each of the plurality of test units;
   a power source that is shared by the plurality of test units, the power source supplying power to each of the plurality of test units; and
   a pressure source that is shared by the plurality of test units, the pressure source supplying a pressure to each of the plurality of test units, wherein
   each of the plurality of test units includes:
   a test module that transmits and receives a test signal to/from a plurality of circuits formed on a wafer under test;
   a connector that connects together transmission paths of the test signal between the test module and the wafer under test;
   a holding member that brings the wafer under test into contact with the connector when supplied with the pressure; and
   a housing that houses therein the holding member and the connector, the wafer under test to be tested within the housing, when supplied with a negative pressure, the holding member attracts by suction the wafer under test to bring the wafer under test into contact with the connector, the holding member contacts airtight with a smooth region of the wafer under test, at a peripheral edge portion of the wafer under test, that is adjacent to a circuit region in which the plurality of circuits are formed, in a vicinity of the circuit region, to attract the wafer under test by suction.

2. The testing apparatus as set forth in claim 1, wherein each of the plurality of test units further includes
   a valve that connects or disconnects communication between the pressure source and the holding member.

3. The testing apparatus as set forth in claim 1, wherein each of the plurality of test units further includes
   a power management section that stabilizes the power supplied from the power source.

4. The testing apparatus as set forth in claim 1, wherein the test module has:
   an individual cut-off device that interrupts an overcurrent from each of the plurality of circuits included in the wafer under test; and
   a collective cut-off device that interrupts an overcurrent from the entire wafer under test.

5. The testing apparatus as set forth in claim 1, wherein all of the plurality of test units have the same structure.

6. The testing apparatus as set forth in claim 1, wherein the plurality of test units are stacked vertically.

7. The testing apparatus as set forth in claim 6, wherein transport mechanism includes:
   a guide pole positioned vertically; and
   a manipulator operable to move up and down along the guide pole.

8. The testing apparatus as set forth in claim 7, wherein the guide pole covers the entire height of the stacked plurality of test units.

9. The testing apparatus as set forth in claim 7, wherein the manipulator includes:
   a lift operable to move up and down along the guide pole;
   a pantograph supported by the lift and operable to expand and contract while moving up and down; and
   a chuck supported by the pantograph.

10. The testing apparatus as set forth in claim 9, wherein the angles formed between the lift and the pantograph and between the
    pantograph and the chuck can be changed.

* * * * *